United States Patent
Kim et al.

(10) Patent No.: US 7,915,968 B2
(45) Date of Patent: Mar. 29, 2011

(54) DIGITALLY CONTROLLED OSCILLATOR (DCO)

(75) Inventors: Tae-wook Kim, Gyeonggi-do (KR); Choong-yul Cha, Gyeonggi-do (KR); Jae-sup Lee, Gyeonggi-do (KR); Kang-yoon Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 331 days.

(21) Appl. No.: 12/104,494

(22) Filed: Apr. 17, 2008

(65) Prior Publication Data
US 2009/0153259 A1 Jun. 18, 2009

(30) Foreign Application Priority Data
Dec. 14, 2007 (KR) .................. 10-2007-0131073

(51) Int. Cl.
*H03B 5/12* (2006.01)

(52) U.S. Cl. .................. 331/181; 331/117 FE; 331/36 L
(58) Field of Classification Search .................. 331/181, 331/36 L, 177 R, 179, 117 R, 117 FE, 167
See application file for complete search history.

(56) References Cited

U.S. PATENT DOCUMENTS

| | | | | |
|---|---|---|---|---|
| 5,850,163 | A * | 12/1998 | Drost et al. | 331/115 |
| 6,784,755 | B2 * | 8/2004 | Lin et al. | 331/57 |
| 7,683,681 | B2 * | 3/2010 | Jang et al. | 327/118 |
| 2006/0232348 | A1 * | 10/2006 | Hino | 331/167 |

* cited by examiner

*Primary Examiner* — Robert Pascal
*Assistant Examiner* — Ryan Johnson
(74) *Attorney, Agent, or Firm* — NSIP Law

(57) ABSTRACT

A digitally controlled oscillator (DCO) includes a current generator which generates an electric current having a magnitude corresponding to an input signal, and a digitally controlled oscillating unit which generates an oscillating frequency based on an inductance which varies according to the magnitude of the electric current generated by the current generator.

8 Claims, 7 Drawing Sheets

DIGITALLY CONTROLLED OSCILLATOR (DCO)

CROSS-REFERENCE TO RELATED APPLICATIONS

This application claims the benefit under 35 U.S.C. §119(a) of a Korean Patent Application No. 10-2007-0131073, filed on Dec. 14, 2007, in the Korean Intellectual Property Office, the disclosure of which is incorporated herein by reference in its entirety.

TECHNICAL FIELD

The following description relates to an oscillator for a phase locked loop (PLL), and more particularly, to a digitally controlled oscillator (DCO) for a PLL.

BACKGROUND

A phase locked loop (PLL) is typically an automatic control system capable of tracking the frequency and phase of an input signal, and is widely utilized in the field of frequency control. It traces and locks the phase and frequency of an output signal and an input signal such that the phase and frequency of the output signal and the input signal tend to be the same. A PLL may also detect changes in a phase and frequency and adjust the phase and frequency to obtain an output signal having a fixed phase and frequency.

Analog PLLs are widely used in a variety of transceivers and devices. Recently, attempts have been made to reduce the size of a system-on-a-chip (SoC), and supply voltage has also been reduced. However, analog PLLs may be increasingly sensitive to external noise in such a case.

In order to achieve more accurate PLL control, a digitally controlled oscillator (DCO) has been proposed. Generally, a DCO is based on an inductor capacitor (LC) oscillator, to obtain an oscillating frequency represented by the following Equation 1 according to the inductance L and the capacitance C of the DCO:

$$f = \frac{1}{2\pi\sqrt{LC}}. \quad \text{[Equation 1]}$$

Accordingly, the DCO based on the LC oscillator is able to tune to an oscillating frequency by changing the capacitance.

However, the DCO for changing the capacitance has a resolution of the DCO, that is, a resolution of an output frequency of the DCO according to an input signal, limited by the capacitance.

Additionally, the DCO for changing the capacitance requires a plurality of capacitors in order to output various oscillating frequencies, but having a plurality of capacitors may be inefficient in costs and size. Furthermore, even where a plurality of capacitors is used, it may be impossible to reduce the intervals between neighboring frequencies below a predetermined range. Accordingly, it is difficult to implement an oscillator having a high resolution.

SUMMARY

In one general aspect, there is provided a digitally controlled oscillator (DCO) for tuning to a frequency by changing an inductance.

In another general aspect, a digitally controlled oscillator (DCO) includes a current generator which generates an electric current having a magnitude corresponding to an input signal and a digitally controlled oscillating unit which generates an oscillating frequency based on an inductance which varies according to the magnitude of the electric current generated by the current generator.

The digitally controlled oscillating unit may comprise an active inductor unit, an inductance of which varies according to the magnitude of the electric current generated by the current generator.

The digitally controlled oscillating unit may further comprise a passive inductor unit which may have a fixed inductance and connected in parallel to the active inductor unit.

The active inductor may comprise a first transconductance providing unit which provides a first transconductance which varies according to the magnitude of the electric current, a second transconductance providing unit which provides a second transconductance which varies according to the magnitude of the electric current, the second transconductance providing unit being connected in parallel to the first transconductance providing unit, and a capacitor unit which provides a capacitance, the capacitor unit being connected in series to the first transconductance providing unit and second transconductance providing unit.

The active inductor unit may provide a variable inductance represented by the following Equation:

$$L_{eq} = \frac{C_p}{G_{m1} G_{m2}}$$

wherein, $C_p$ indicates the capacitance of the capacitor unit, $G_{m1}$ indicates the first transconductance, and $G_{m2}$ indicates the second transconductance.

The active inductor unit may comprise a first transistor unit having a first transconductance which varies according to the magnitude of the electric current, a second transistor unit having a second transconductance which varies according to the magnitude of the electric current, and a capacitor unit which is connected to a connection node between the first transistor unit and the second transistor unit.

The current generator may comprise a switching unit which comprises a plurality of current sources having different magnitudes, a plurality of switches respectively connected to the plurality of current sources, and a controller which activates or deactivates the plurality of switches according to the input signal. The input signal may be a digital signal.

The current generator may comprise a decoder which decodes the digital input signal on completion of a predetermined bit period, a converting unit which outputs an analog voltage corresponding to a decoded value, and a current power unit which transfers an electric current corresponding to the analog voltage to the active inductor unit.

The digitally controlled oscillating unit may further comprise a capacitor bank in which a plurality of capacitors is connected in parallel.

Other features will become apparent to those skilled in the art from the following detailed description, which, taken in conjunction with the attached drawings, discloses exemplary embodiments of the invention.

BRIEF DESCRIPTION OF THE DRAWINGS

Throughout the drawings and the detailed description, the same drawing reference numerals will be understood to refer to the same elements, features, and structures.

DETAILED DESCRIPTION OF EXEMPLARY EMBODIMENTS

The following detailed description is provided to assist the reader in gaining a comprehensive understanding of the methods, apparatuses and/or systems described herein. Accordingly, various changes, modifications, and equivalents of the systems, apparatuses and/or methods described herein will be suggested to those of ordinary skill in the art. Also, description of well-known functions and constructions are omitted to increase clarity and conciseness.

Figure 1:
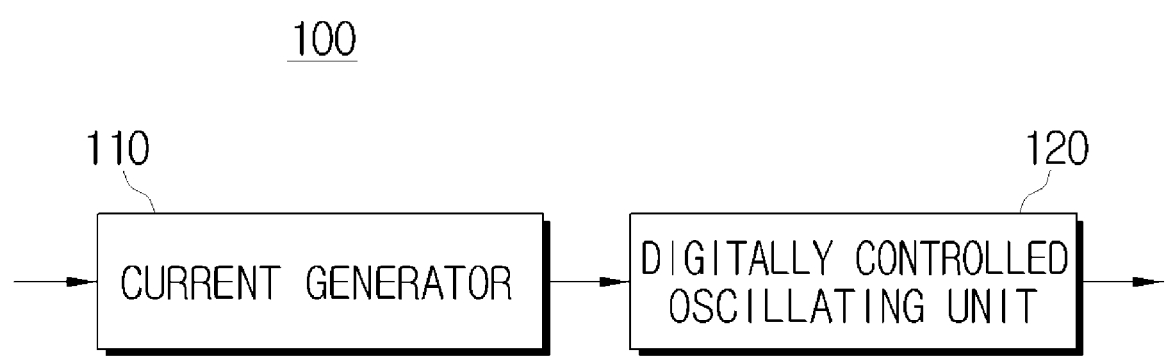
FIG. 1 is a block diagram illustrating an exemplary digitally controlled oscillator (DCO).

FIG. 1 illustrates an exemplary digitally controlled oscillator (DCO) 100. The DCO 100 includes a current generator 110 and a digitally controlled oscillating unit 120. The current generator 110 generates an electric current having a magnitude corresponding to an input signal. The digitally controlled oscillating unit 120 generates an oscillating frequency based on an inductance which varies according to the magnitude of the electric current generated by the current generator 100. The signal input to the current generator 110 may be a digital signal.

Figure 2:
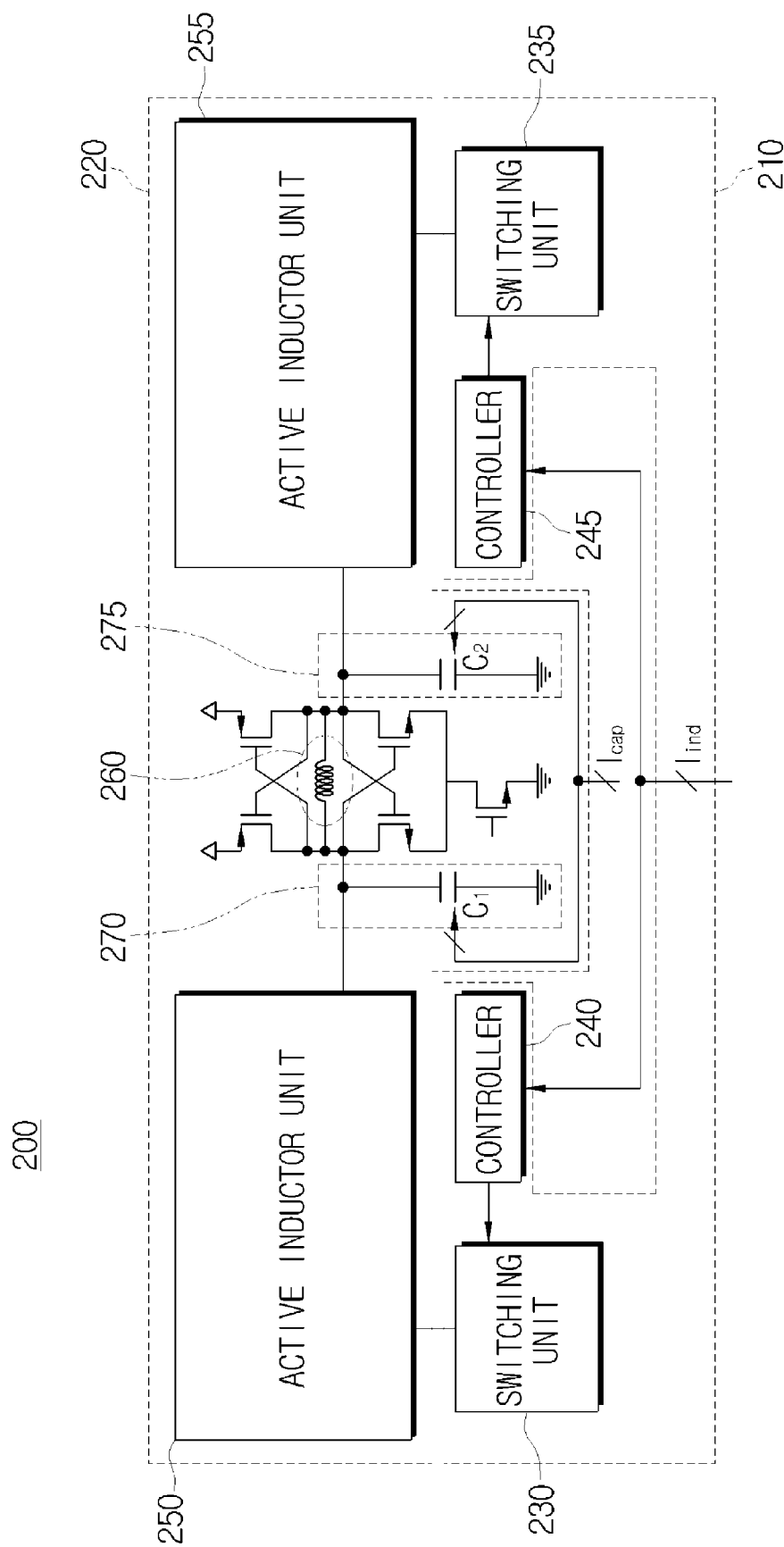
FIG. 2 is a configuration diagram illustrating an exemplary DCO.

FIG. 2 illustrates an exemplary DCO 200. The DCO 200 includes a current generator 210 and a digitally controlled oscillating unit 220. The current generator 210 includes switching units 230 and 235, and controllers 240 and 245. The digitally controlled oscillating unit 220 includes active inductor units 250 and 255, a passive inductor unit 260 and capacitor banks 270 and 275.

As illustrated in FIG. 2, an input signal $I_{ind}$ is input to change the total inductance L of the active inductor units 250 and 255 and passive inductor unit 260. Another input signal $I_{cap}$ is input to change the total capacitance C of the capacitor banks 270 and 275. According to an aspect, the input signals $I_{ind}$ and $I_{cap}$ are digital signals.

Figure 3:
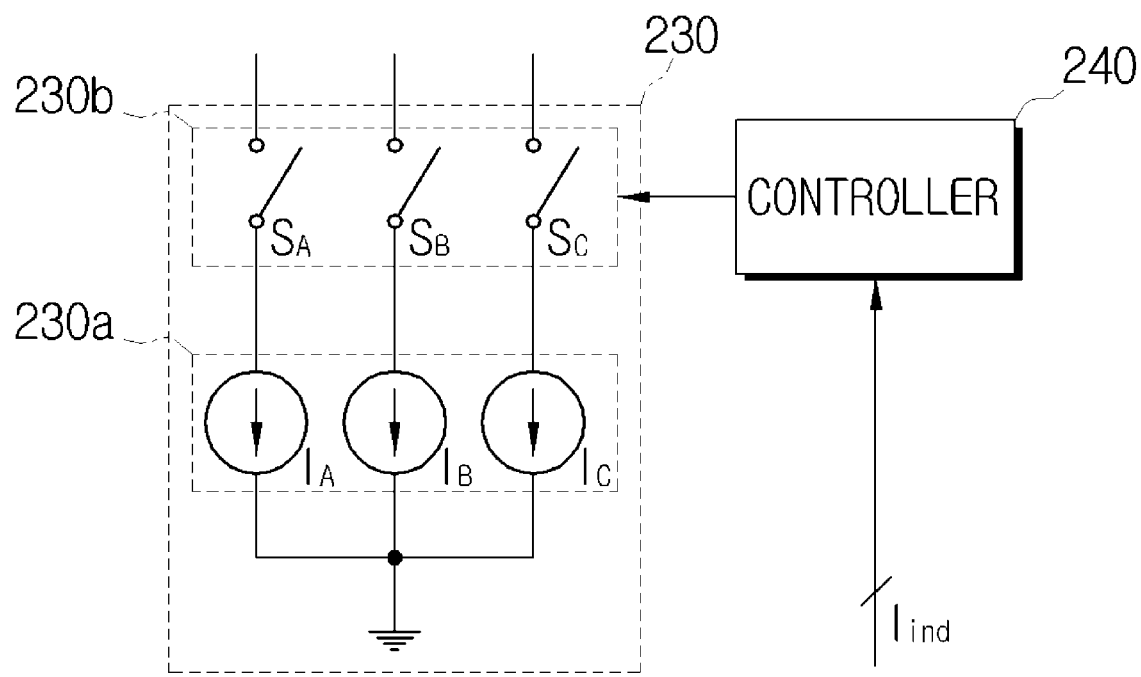
FIG. 3 is a block diagram illustrating an exemplary current generator.

FIG. 3 illustrates an example of the current generator 210 of FIG. 2. The current generator 210 includes the switching unit 230 and the controller 240. The switching unit 230 includes a plurality of current sources 230a and a plurality of switches 230b.

Hereinafter, referring to FIGS. 2 and 3, description will be given of a situation in which the total capacitance C of the DCO 200 determined according to capacitances C1 and C2 of the capacitor banks 270 and 275 may be fixed, and the total inductance L of the DCO 200 determined according to inductances of the active inductor units 250 and 255 and passive inductor unit 260 is varied by the digital input signal $I_{ind}$.

For example, where a 3-bit digital input signal $I_{ind}$ is input to the current generator 210, the digital input signal $I_{ind}$ may be represented as eight digital signals, namely "000", "001", "010", ..., "110" and "111". The controller 240 may turn on or off the plurality of switches 230b according to the digital input signal $I_{ind}$.

Additionally, each current source $I_A$, $I_B$ and $I_C$ may respectively supply electric currents of $2^0[A](=0)$, $2^1[A](=2)$ and $2^2[A](=4)$, so that the electric currents may flow. Where the digital input signal $I_{ind}$ represented as "001" is input to the switching unit 230 of the current generator 210, the controller 240 may activate only a switch SA and deactivate switches SB and $S_C$, so as to generate an electric current having a magnitude corresponding to the 3-bit digital input signal $I_{ind}$. The number of the current sources 230a which may have different magnitudes and of the switches 230b individually connected to the current sources 230a included in the switching unit 230 may be determined according to the number of bit streams of the digital input signal $I_{ind}$.

The electric current which is generated by the current generator 210, and the magnitude of which corresponds to the digital input signal $I_{ind}$, is input to the active inductor units 250 and 255 of the digitally controlled oscillating unit 220. The inductance of the active inductor units 250 and 255 may change according to the magnitude of the electric current generated by the current generator 210. Accordingly, the total inductance L of the DCO 200 may also change, and it is possible to generate an oscillating frequency of the DCO 200. According to an aspect, the active inductor units 250 and 255 may be implemented as semiconductor devices such as transistors. Detailed description of the operation of the digitally controlled oscillating unit 220 will be described later.

Figure 4:
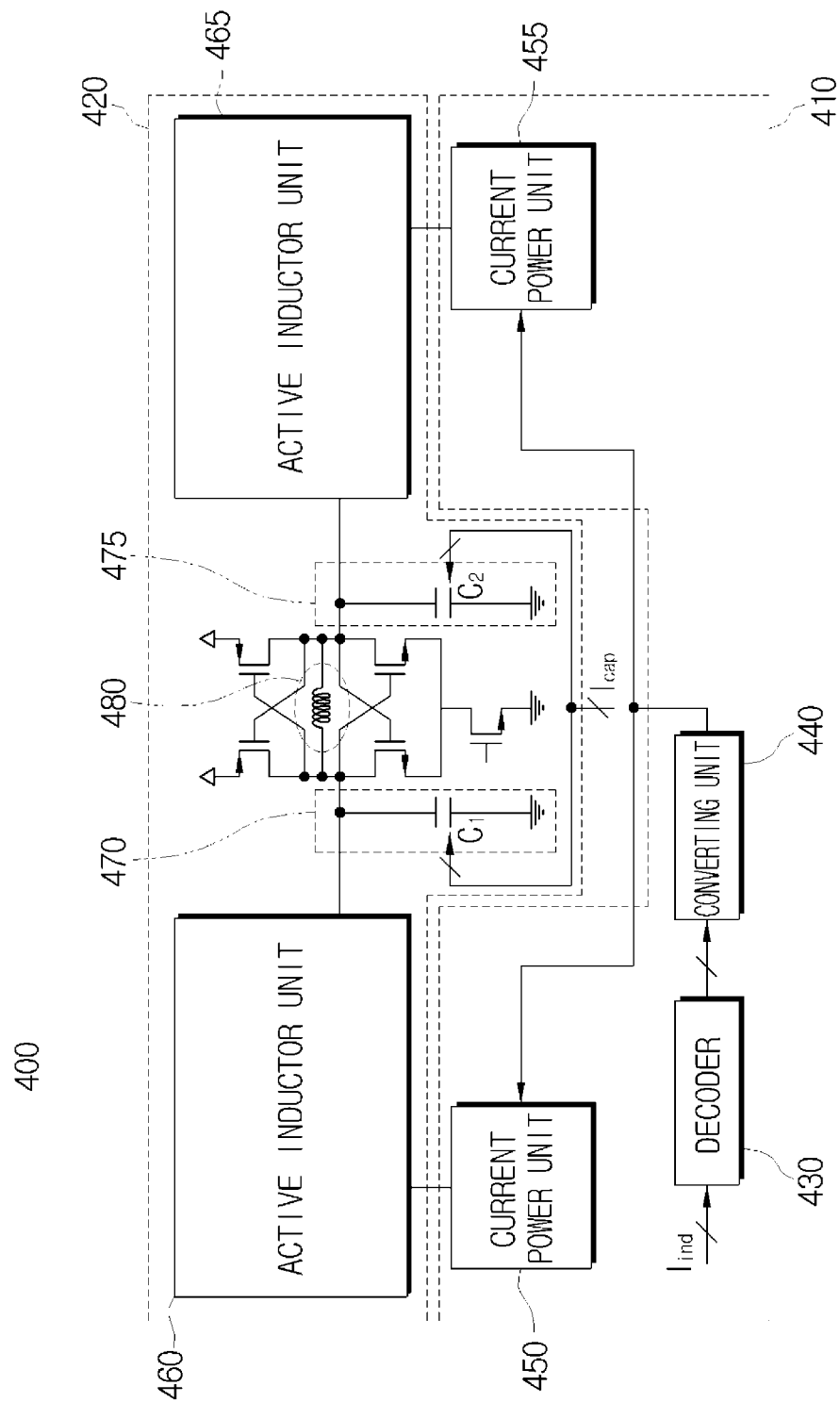
FIG. 4 is a configuration diagram illustrating another exemplary DCO.

FIG. 4 illustrates another exemplary DCO 400. The DCO 400 includes a current generator 410 and a digitally controlled oscillating unit 420. The current generator 410 includes a decoder 430, a converting unit 440, and current power units 450 and 455. The digitally controlled oscillating unit 420 includes active inductor units 460 and 465, a passive inductor unit 480 and capacitor banks 470 and 475, and may perform functions similarly to that of the digitally controlled oscillating unit 220 of FIG. 2.

Where a digital input signal $I_{ind}$ is input, the decoder 430 may decode the input digital input signal on completion of a predetermined bit period. The converting unit 440 may output an analog voltage corresponding to a decoded value. The current power units 450 and 455 may transfer an electric current corresponding to the analog voltage to the active inductor units 460 and 465. As a non-limiting illustration, the converting unit 440 may be implemented as a voltage distributor, or as a digital to analog converter (DAC), such as a Sigma-Delta DAC, which is capable of converting digital signals to analog signals.

For example, a 3-bit digital input signal $I_{ind}$ may be input to the decoder 430, as described above in FIG. 2. The decoder 430 may decode the eight digital signals "000", "001", "010", ..., "110" and "111" into decoded values "0", "1", "2", ..., "6", "7", respectively. The converting unit 440 may convert the decoded values into analog voltage values, namely 0 V, 0.142 V, 0.285 V, ..., 0.875 V and 1 V. The analog voltage values converted by the converting unit 440 may be input to the current power units 450 and 455. The current power units 450 and 455 may be implemented, for example, as an NMOS transistor. In this case, each of the analog voltage values may be applied between a gate terminal and a source terminal of the NMOS transistor. Accordingly, the magnitude of electric current flowing from an external source through a drain terminal of the NMOS transistor may change according to the applied voltage values. Therefore, as described above in FIG. 2, the inductance of the active inductor units 460 and 465 may change depending on the magnitude of the electric current generated by the current generator 410. Accordingly, the total inductance of a DCO 400 may also change according to a change in the inductance of the active inductor units 460 and 465, and it is possible to generate an oscillating frequency of the DCO 400.

Figure 5:
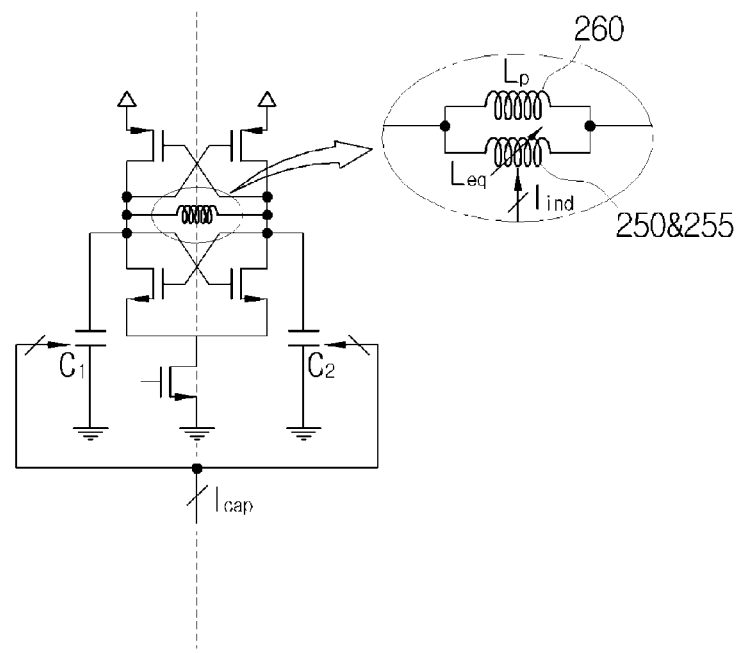
FIG. 5 is a schematic diagram illustrating an arrangement of inductor units of a DCO according to an exemplary embodiment.

FIG. 5 schematically illustrates how the active inductor units 250 and 255 and the passive inductor unit 260 are arranged in the DCO 200 according to an exemplary embodiment. The DCO 200 has a left and right symmetrical structure along an axis indicated by the dotted line shown in FIG. 5. According to an aspect, the passive inductor unit 260 may include two inductors having the same inductance which are connected in series. Additionally, a virtual ground is formed in a node between the two inductors. Accordingly, the active inductor units 250 and 255 may be connected in parallel to the passive inductor unit 260. Therefore, the total inductance L used to determine the oscillating frequency of the DCO 200 may be computed using an active inductance $L_{eq}$ and a passive inductance $L_p$.

According to another aspect, the DCO 200 may include only the active inductor units 250 and 255 without the passive inductor unit 260. In this case, it is possible to generate an oscillating frequency of the DCO 200 by changing the total inductance of the DCO 200 by the active inductor units 250 and 255.

Figure 6:
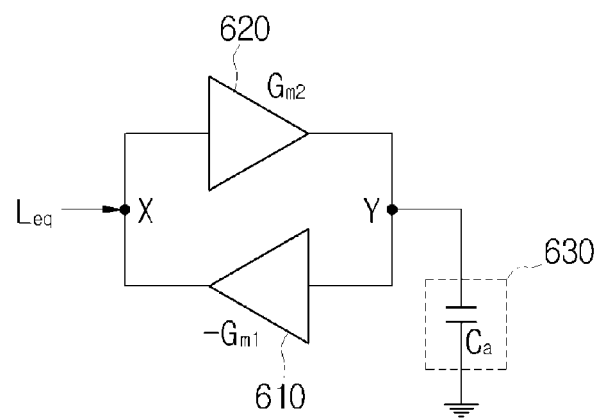
FIG. 6 is a circuit diagram illustrating an active inductor unit of a DCO according to an exemplary embodiment.

FIG. 6 illustrates a circuit of an active inductor unit of a DCO according to an exemplary embodiment. For example, the active inductor units 250, 255 (or 460, 465) may respectively include a first transconductance providing unit 610, a second transconductance providing unit 620 and a capacitor unit 630. The first transconductance providing unit 610 provides a first transconductance, which varies according to a change in the magnitude of the electrical current output from the current generator 210 (or 410). The second transconductance providing unit 620 provides a second transconductance, and is connected in parallel to the first transconductance providing unit 610. The second transconductance also varies according to the change in the magnitude of the electrical current output from the current generator 210 or 410. The capacitor unit 630 provides a capacitance, and is connected in series to the first transconductance providing unit 610 and second transconductance providing unit 620 which are connected in parallel. The equivalent inductance $L_{eq}$ of the active inductor units 250, 255 (or 460, 465) may be represented by the following Equation 2:

$$L_{eq} = \frac{C_p}{G_{m1} G_{m2}} \quad \text{[Equation 2]}$$

wherein, $C_p$ indicates the capacitance of the capacitor unit, $G_{m1}$ indicates the first transconductance, and $G_{m2}$ indicates the second transconductance.

Figure 7:
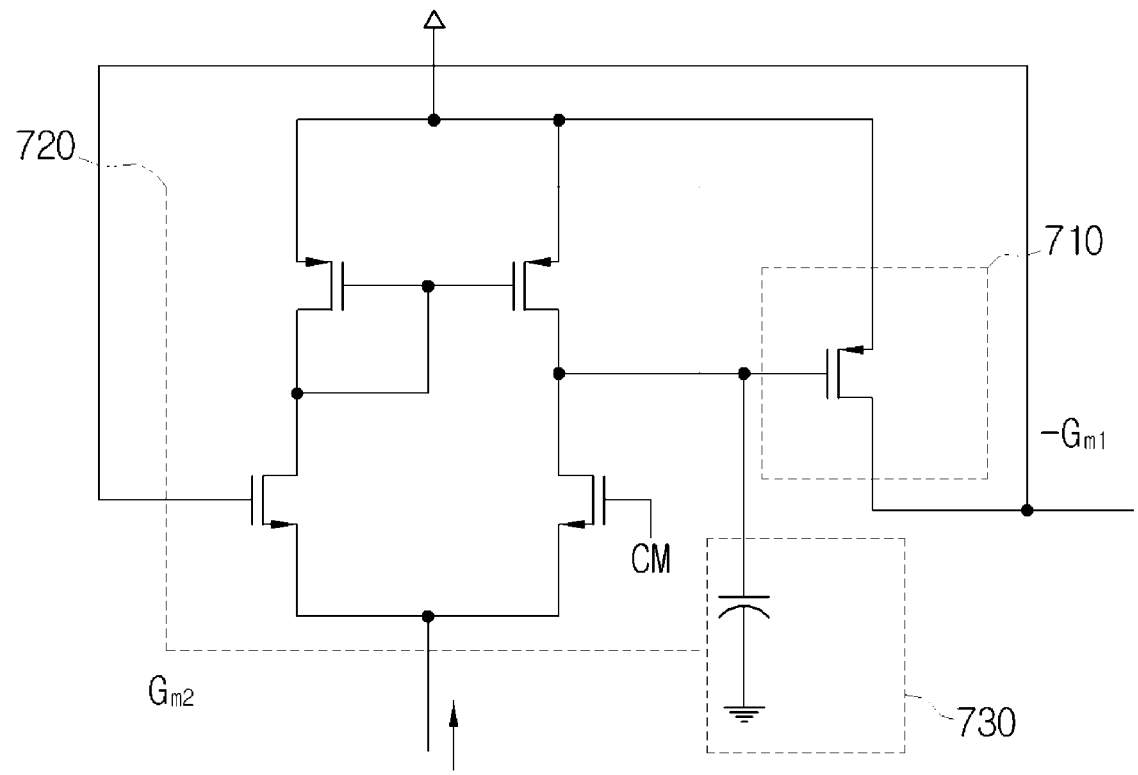
FIG. 7 is a circuit diagram illustrating an active inductor unit of a DCO according to another exemplary embodiment.

FIG. 7 illustrates an active inductor unit of a DCO according to another exemplary embodiment. The active inductor units 250, 255 (or 460, 465) shown in FIG. 2 (or FIG. 4) which are able to be implemented in the circuit configuration of FIG. 6 may also be implemented using the circuit configuration of FIG. 7. The active inductor units 250, 255 (or 460, 465) respectively include a first transistor unit 710 having the first transconductance, a second transistor unit 720 having the second transconductance, and a capacitor unit 730 which is connected to a connection node between the first transistor unit 710 and the second transistor unit 720.

Referring to FIGS. 2 and 7, where electric currents having different magnitudes are applied to the second transistor unit 720 of the active inductor units 250 and 255, the second transconductance $G_{m2}$ of the second transistor unit 720 having a current mirror structure may change. Similarly, the first transconductance $G_{m1}$ of the first transistor unit 710 may also change. Accordingly, the inductance $L_{eq}$ of the active inductor units 250 and 255 may change, as shown by the Equation 2. Therefore, the change in the total inductance of the DCO 200 may enable generation of an oscillating frequency.

Figure 8A:
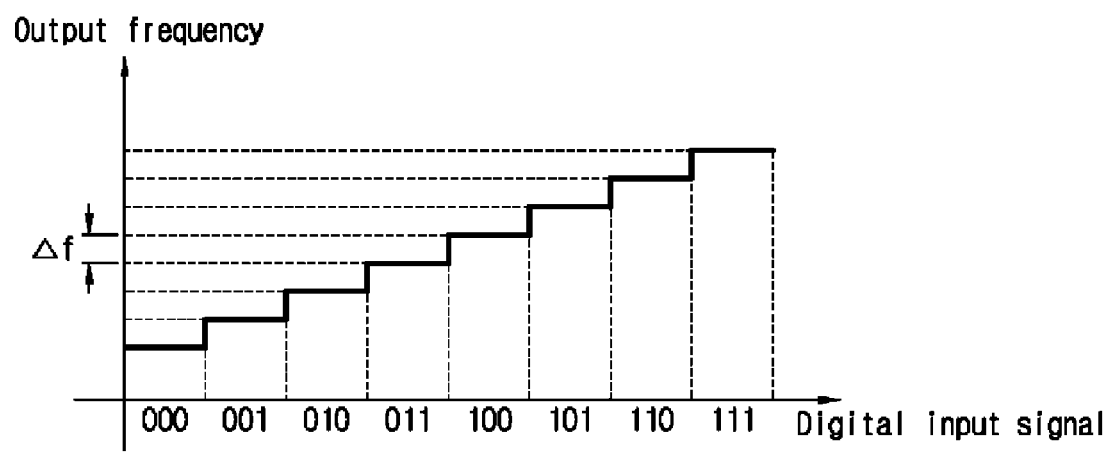
FIG. 8A is a graph illustrating output frequency signals of a DCO according to an exemplary embodiment, where an inductance changes.

FIG. 8A illustrates output frequency signals of a DCO according to an exemplary embodiment, where the inductance changes. FIG. 8A illustrates oscillating frequencies generated according to a 3-bit digital input signal. An interval $\Delta f$ between the output oscillating frequencies indicates a resolution. The interval $\Delta f$ is inversely proportional to the resolution of the oscillating frequency. Where an oscillating frequency is generated by variation in the total capacitance of a conventional DCO, it is difficult for the oscillating frequency to have a resolution greater than a predetermined value at the time of manufacture. However, the total inductance L changes in the DCO according to the exemplary embodiments disclosed herein, so the DCO may have a greater resolution compared to the situation in which the capacitance changes. Therefore, a fixed frequency of a digital phase locked loop (PLL) having the DCO disclosed herein may be accurately tuned.

Figure 8B:
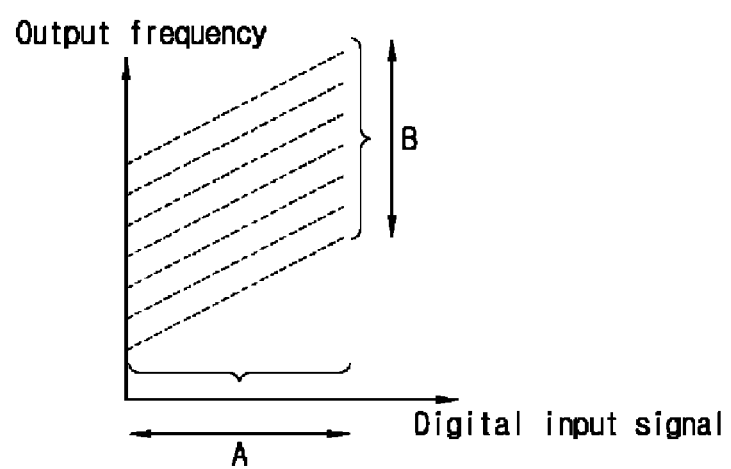
FIG. 8B is a graph illustrating output frequency signals of a DCO according to an exemplary embodiment, where both an inductance and capacitance change.

FIG. 8B illustrates output frequency signals of a DCO according to an exemplary embodiment where both the inductance and the capacitance change. Referring to FIGS. 2 and 8A, oscillating frequencies are generated by, for example, the DCO of FIG. 2 according to the digital input signal $I_{ind}$ to change the inductance L, where the digital input signal $I_{cap}$ to change the capacitance C of the capacitor banks 270 and 275 is fixed. FIG. 8B shows a graph obtained where the digital input signal $I_{cap}$ to change the capacitance C and the digital input signal $I_{ind}$ to change the inductance L change. Additionally, FIG. 8B shows dots to indicate that each digital input signal has a specific frequency value.

According to an aspect, the DCO 200 or 400 causes intervals between the dots of FIG. 8B to be reduced horizontally as indicated by arrow A of FIG. 8B using the digital input signal $I_{ind}$ to change the inductance L, so it may be possible to precisely tune to oscillating frequencies being generated. Additionally, it may be possible to tune to the oscillating frequencies of the DCO vertically as indicated by arrow B of FIG. 8B using the digital input signal $I_{cap}$, which is received through the capacitor banks 270, 275 (or 470, 475) in which a plurality of capacitors are connected in parallel.

While a DCO according to an embodiment is described as receiving a 3-bit digital input signal, it is understood that this is only exemplary, and that the DCO may receive a multi-bit digital input signal. That is, it is understood that an input signal supplied to a current generator of the DCO may be a digital signal or other types of input signal known or to be known to one skilled in the art.

A number of exemplary embodiments have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A digitally controlled oscillator (DCO) comprising:
a current generator which generates an electric current having a magnitude corresponding to an input signal; and a digitally controlled oscillating unit which generates an oscillating frequency based on an inductance which varies according to the magnitude of the electric current generated by the current generator, the digitally controlled oscillating unit comprising:
an active inductor unit, an inductance of which varies according to the magnitude of the electric current generated by the current generator; and
a passive inductor unit which has a fixed inductance and is connected in parallel to the active inductor unit.

2. The DCO of claim 1, wherein the active inductor unit comprises:
a parallel transconductance providing unit, comprising:
a first transconductance providing unit which provides a first transconductance which varies according to the magnitude of the electric current; and
a second transconductance providing unit which provides a second transconductance which varies according to the magnitude of the electric current, the second transconductance providing unit being connected in parallel to the first transconductance providing unit; and
a capacitor unit which provides a capacitance, the capacitor unit being connected in series to the parallel transconductance providing unit.

3. The DCO of claim 2, wherein the active inductor unit provides a variable inductance represented by the following Equation:

$$L_{eq} = \frac{C_p}{G_{m1} G_{m2}}$$

wherein, $C_p$ indicates the capacitance of the capacitor unit, $G_{m1}$ indicates the first transconductance, and $G_{m2}$ indicates the second transconductance.

4. The DCO of claim 1, wherein the active inductor unit comprises:
a first transistor unit having a first transconductance which varies according to the magnitude of the electric current;
a second transistor unit having a second transconductance which varies according to the magnitude of the electric current; and
a capacitor unit which is connected to a connection node between the first transistor unit and the second transistor unit.

5. The DCO of claim 1, wherein the current generator comprises:
a switching unit which comprises:
a plurality of current sources having different magnitudes; and
a plurality of switches respectively connected to the plurality of current sources; and
a controller which activates or deactivates the plurality of switches according to the input signal.

6. The DCO of claim 1, wherein the current generator comprises:
a decoder which decodes the input signal on completion of a predetermined bit period and outputs a decoded value;
a converting unit which outputs an analog voltage corresponding to the decoded value; and
a current power unit which transfers an electric current corresponding to the analog voltage to the active inductor unit.

7. The DCO of claim 1, wherein the digitally controlled oscillating unit further comprises a capacitor bank in which a plurality of capacitors are connected in parallel.

8. The DCO of claim 1, wherein the input signal is a digital signal.

* * * * *